(12) United States Patent
Lee

(10) Patent No.: US 12,532,729 B2
(45) Date of Patent: Jan. 20, 2026

(54) SEMICONDUCTOR PACKAGE

(71) Applicant: SAMSUNG ELECTRONICS CO., LTD., Suwon-si (KR)

(72) Inventor: Taeyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 332 days.

(21) Appl. No.: 18/133,141

(22) Filed: Apr. 11, 2023

(65) Prior Publication Data

US 2024/0030103 A1 Jan. 25, 2024

(30) Foreign Application Priority Data

Jul. 19, 2022 (KR) .................. 10-2022-0088977

(51) Int. Cl.
*H01L 23/48* (2006.01)
*H01L 25/065* (2023.01)
*H01L 23/00* (2006.01)

(52) U.S. Cl.
CPC ........ *H01L 23/481* (2013.01); *H01L 25/0657* (2013.01); *H01L 24/08* (2013.01);
(Continued)

(58) Field of Classification Search
CPC ... H01L 23/481; H01L 25/0657; H01L 24/08; H01L 24/16
See application file for complete search history.

(56) References Cited

U.S. PATENT DOCUMENTS 7,816,776 B2 * 10/2010 Choi ................ H01L 24/17
257/E23.012
8,358,016 B2 * 1/2013 Suh .................. H01L 25/0657
257/E23.098

(Continued)

FOREIGN PATENT DOCUMENTS

CN 109273574 B * 12/2023 .......... H10H 20/852
EP 4135030 A2 * 2/2023 ............. H01L 23/62
(Continued)

OTHER PUBLICATIONS

Office Action dated Dec. 1, 2025 issued in corresponding to Korean Patent Application No. 10-2022-0088977.

*Primary Examiner* — Laura M Menz
(74) *Attorney, Agent, or Firm* — Morgan, Lewis & Bockius LLP

(57) ABSTRACT

A semiconductor package includes: a first semiconductor chip including a plurality of first through-electrodes and a plurality of first shared electrodes, wherein the first through-electrodes are arranged in a first direction, wherein the plurality of first shared electrodes are spaced apart from the plurality of first through-electrodes in a second direction, intersecting the first direction, and are electrically connected to the plurality of first through-electrodes, respectively; and a second semiconductor chip including a plurality of second through-electrodes and a plurality of second shared electrodes, wherein the plurality of second through-electrodes are disposed on the first semiconductor chip and are arranged in the first direction, wherein the plurality of second shared electrodes are spaced apart from the plurality of second through-electrodes in the second direction and are electrically connected to the plurality of second through-electrodes, respectively.

9 Claims, 12 Drawing Sheets

(52) U.S. Cl.
CPC .... *H01L 24/16* (2013.01); *H01L 2224/08146* (2013.01); *H01L 2224/16146* (2013.01); *H01L 2225/06562* (2013.01)

(56) References Cited

U.S. PATENT DOCUMENTS

| | | | |
|---|---|---|---|
| 9,048,235 B2 | 6/2015 | Choi | |
| 9,184,137 B2* | 11/2015 | Lee | H01L 23/481 |
| 9,824,954 B2* | 11/2017 | Kamiya | H01L 24/92 |
| 9,853,012 B2* | 12/2017 | Chung | H01L 24/97 |
| 11,004,829 B2* | 5/2021 | Vodrahalli | H01L 25/50 |
| 11,164,833 B2* | 11/2021 | Park | H01L 25/0657 |
| 12,300,619 B2* | 5/2025 | Chen | H01L 21/568 |
| 2010/0182042 A1 | 7/2010 | Law et al. | |
| 2011/0291232 A1* | 12/2011 | Yen | H01L 23/49822 336/200 |
| 2012/0175783 A1* | 7/2012 | Suh | H01L 25/0657 257/774 |
| 2014/0061866 A1* | 3/2014 | Lee | H01L 23/481 257/659 |
| 2014/0264734 A1* | 9/2014 | Luo | H01L 23/5384 336/200 |
| 2016/0093598 A1* | 3/2016 | Jo | H01L 23/36 257/713 |
| 2016/0148909 A1* | 5/2016 | Chung | H01L 21/76898 257/778 |
| 2017/0243856 A1* | 8/2017 | Park | H01L 25/50 |
| 2018/0233490 A1* | 8/2018 | Chu | H01L 24/82 |
| 2018/0331076 A1* | 11/2018 | Park | H01L 23/3128 |
| 2019/0109121 A1 | 4/2019 | Chu et al. | |
| 2019/0172903 A1* | 6/2019 | Wang | H01L 25/165 |
| 2019/0363079 A1* | 11/2019 | Thei | H01L 24/89 |
| 2020/0006241 A1* | 1/2020 | Wu | H01L 23/5383 |
| 2020/0035672 A1 | 1/2020 | Thei et al. | |
| 2020/0043783 A1* | 2/2020 | Kao | H01L 21/76254 |
| 2021/0296283 A1* | 9/2021 | Huang | H01L 23/528 |
| 2021/0398947 A1* | 12/2021 | Shin | H01L 24/32 |
| 2022/0003948 A1* | 1/2022 | Zhou | G02F 1/212 |
| 2022/0020690 A1* | 1/2022 | Kim | H01L 25/0657 |
| 2022/0028848 A1* | 1/2022 | Baek | H01L 25/0652 |
| 2022/0077117 A1* | 3/2022 | Yu | H01L 21/76898 |
| 2023/0040467 A1* | 2/2023 | Chen | H10D 1/68 |
| 2023/0107845 A1* | 4/2023 | Park | H01L 25/50 257/686 |
| 2024/0030103 A1* | 1/2024 | Lee | H01L 25/0657 |
| 2024/0038728 A1* | 2/2024 | Jang | H01L 23/544 |
| 2024/0170458 A1* | 5/2024 | Ji | H01L 24/16 |
| 2024/0266268 A1* | 8/2024 | Kim | H01L 23/49822 |
| 2025/0022787 A1* | 1/2025 | Chung | H01L 24/16 |
| 2025/0149475 A1* | 5/2025 | Ji | H01L 24/05 |
| 2025/0183121 A1* | 6/2025 | Seo | H01L 23/5283 |

FOREIGN PATENT DOCUMENTS

| | | | | |
|---|---|---|---|---|
| JP | 2658657 B2 | * | 9/1997 | |
| JP | 2004356284 A | * | 12/2004 | .......... H10D 62/117 |
| JP | 3687393 B2 | * | 8/2005 | |
| JP | 2006-019328 A | | 1/2006 | |
| JP | 4160447 B2 | * | 10/2008 | .......... H10D 62/117 |
| KR | 20100026392 A | * | 3/2010 | .......... H01L 23/481 |
| KR | 10-2010-0135091 A | | 12/2010 | |
| KR | 20120014952 A | * | 2/2012 | ....... H01L 23/49855 |
| KR | 20140023023 A | * | 2/2014 | ............. H01L 23/48 |
| KR | 20140085874 A | * | 7/2014 | .......... H01L 23/367 |
| KR | 10-2022-0048695 A | | 4/2022 | |
| KR | 20230024714 A | * | 2/2023 | ....... H01L 25/0657 |
| KR | 20240011485 A | * | 1/2024 | ....... H01L 25/0657 |
| WO | WO-2004107440 A1 | * | 12/2004 | .......... H10D 62/117 |

* cited by examiner

SEMICONDUCTOR PACKAGE

CROSS-REFERENCE TO RELATED APPLICATION

This application claims priority under 35 U.S.C. § 119(a) to Korean Patent Application No. 10-2022-0088977 filed on Jul. 19, 2022 in the Korean Intellectual Property Office, the disclosure of which is incorporated by reference herein in its entirety.

TECHNICAL FIELD

The present inventive concept relates to a semiconductor package.

DISCUSSION OF THE RELATED ART

Generally, semiconductor devices included in electronic devices are relatively small in size and have relatively high performance and relatively high capacity. To implement such semiconductor devices, a semiconductor package for interconnecting semiconductor chips, which are stacked in a vertical direction, using a through-electrode (e.g., through silicon via) is under development.

SUMMARY

Example embodiments of the present inventive concept provide a semiconductor package in which semiconductor chips are stacked.

According to an example embodiment of the present inventive concept, a semiconductor package includes: a first semiconductor chip including a plurality of first through-electrodes and a plurality of first shared electrodes, wherein the first through-electrodes are arranged in a first direction, wherein the plurality of first shared electrodes are spaced apart from the plurality of first through-electrodes in a second direction, intersecting the first direction, and are electrically connected to the plurality of first through-electrodes, respectively; and a second semiconductor chip including a plurality of second through-electrodes and a plurality of second shared electrodes, wherein the plurality of second through-electrodes are disposed on the first semiconductor chip and are arranged in the first direction, wherein the plurality of second shared electrodes are spaced apart from the plurality of second through-electrodes in the second direction and are electrically connected to the plurality of second through-electrodes, respectively, wherein a first through-electrode and a first shared electrode, which are electrically connected to each other, from among the plurality of first through-electrodes and the plurality of first shared electrodes are symmetrically arranged with respect to a first point at which a first axis, extending in the first direction and passing through a first center of the first semiconductor chip, and a second axis, extending in the second direction and passing through the first center of the first semiconductor chip, intersect, wherein a second through-electrode and a second shared electrode, which are electrically connected to each other, from among the plurality of second through-electrodes and the plurality of second shared electrodes are symmetrically arranged with respect to a second point at which a third axis, extending in the first direction and passing through a second center of the second semiconductor chip, and a fourth axis, extending in the second direction and passing through the second center of the second semiconductor chip, intersect, and wherein the first through-electrode and the first shared electrode are connected to at least one of the second through-electrode or the second shared electrode.

According to an example embodiment of the present inventive concept, a semiconductor package includes: a plurality of semiconductor chips including a semiconductor substrate, a through-electrode, and a shared electrode, wherein the semiconductor substrate has a front surface and a back surface opposing each other, wherein the through-electrode penetrates through the semiconductor substrate, wherein the shared electrode penetrates through the semiconductor substrate and is electrically connected to the through-electrode, wherein the plurality of semiconductor chips are stacked in a direction substantially perpendicular to the front surface or the back surface, wherein the through-electrode and the shared electrode are spaced apart from each other at substantially equal distances with respect to one point at which a first axis, which passes between the through-electrode and the shared electrode, and a second axis, which passes through a center of a corresponding semiconductor chip among the plurality of semiconductor chips, intersect each other, and at least one of the through-electrode or the shared electrode of a first semiconductor chip of the plurality of semiconductor chips overlaps with at least one of the through-electrode or the shared electrode of a second semiconductor chip of the plurality of semiconductor chips adjacent in a vertical direction.

According to an example embodiment of the present inventive concept, semiconductor package includes: a semiconductor chip including a semiconductor substrate, a circuit layer, a plurality of through-electrodes, and a plurality of shared electrodes, wherein the semiconductor substrate has a front surface and a back surface opposing each other, wherein the circuit layer includes a wiring structure disposed on the front surface, wherein the plurality of through-electrodes are electrically connected to the wiring structure and are arranged in a first direction parallel to the front surface or the back surface, and wherein the plurality of shared electrodes are spaced apart from the plurality of through-electrodes in a second direction, intersecting the first direction, and are electrically connected to the plurality of through-electrodes, respectively, wherein on a plane, at least one pair of a through-electrode and a shared electrode, which are electrically connected to each other, among the plurality of through-electrodes and the plurality of shared electrodes are symmetrically arranged with respect to a point at which a first axis, extending in the first direction between the plurality of through-electrodes and the plurality of shared electrodes, and a second axis, extending in the second direction and passing through a center of the semiconductor chip, intersect each other.

BRIEF DESCRIPTION OF DRAWINGS

The above and other aspects of the present inventive concept become more apparent by describing in detail example embodiments thereof, with reference to the accompanying drawings, in which.

DETAILED DESCRIPTION OF THE EMBODIMENTS

Hereinafter, example embodiments of the present inventive concept will be described with reference to the accompanying drawings.

Figure 1A:
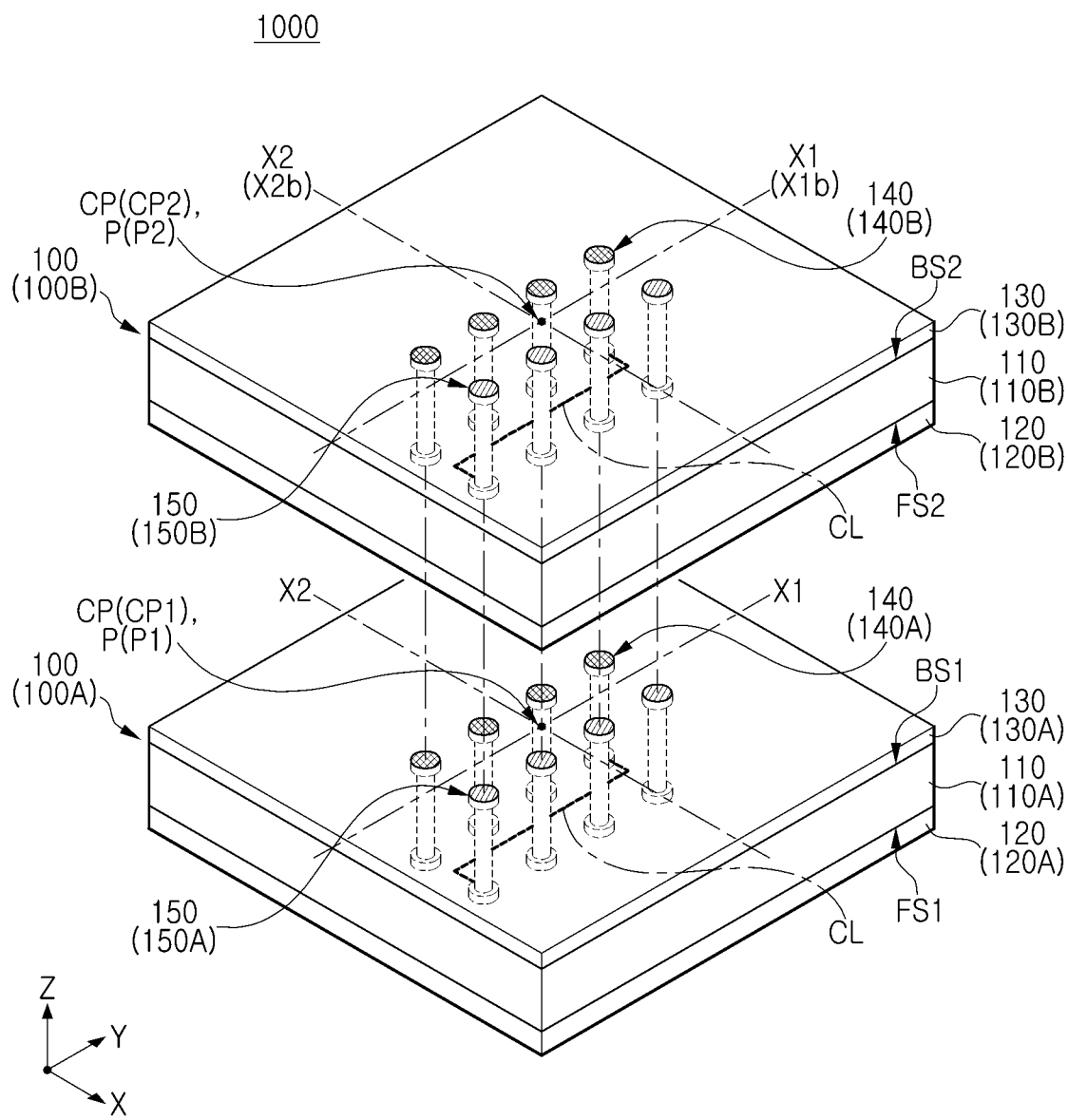
FIG. 1A is an exploded perspective view illustrating a semiconductor package according to an example embodiment of the present inventive concept.
Figure 1B:
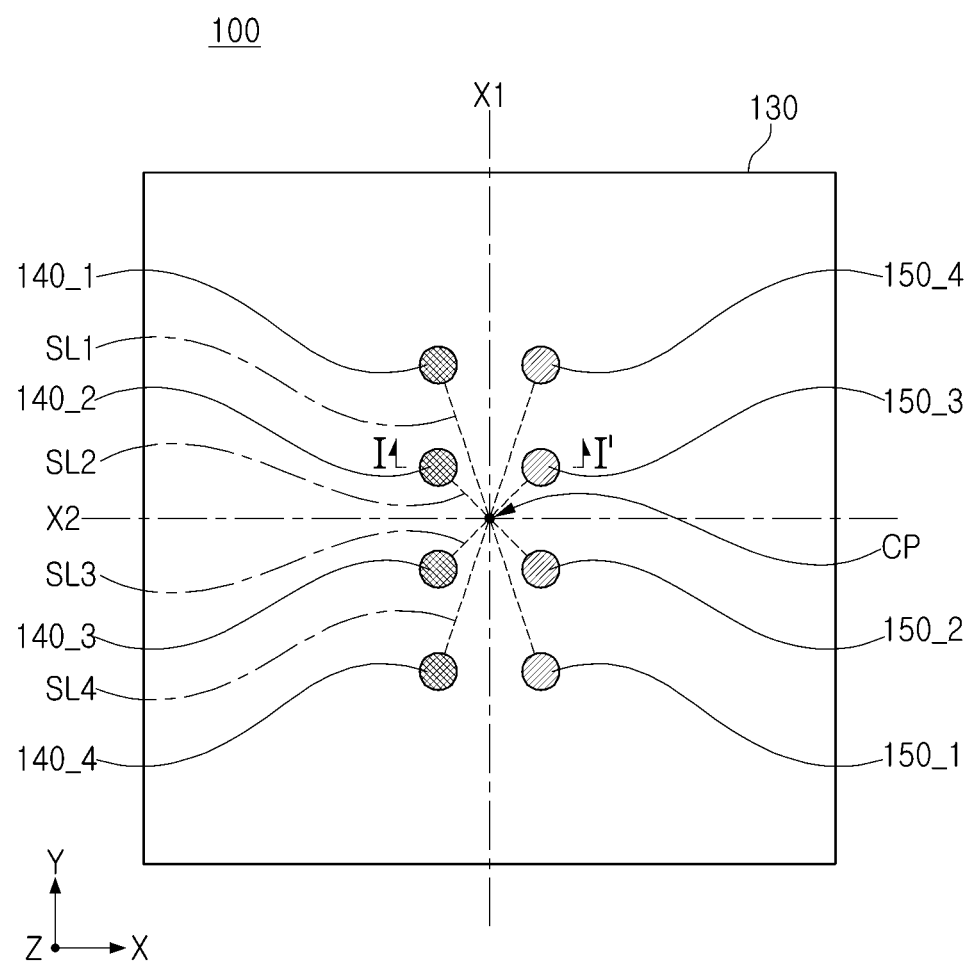
FIG. 1B is a plan view illustrating an upper surface of the semiconductor chip illustrated in FIG. 1A.

FIG. 1A is an exploded perspective view illustrating a semiconductor package 1000 according to an example embodiment of the present inventive concept, and FIG. 1B is a plan view illustrating an upper surface of a semiconductor chip 100 illustrated in FIG. 1A.

Referring to FIGS. 1A and 1B, the semiconductor package 1000 according to an example embodiment of the present inventive concept may include at least one semiconductor chip 100 including at least one through-electrode 140 and at least one shared electrode 150 electrically connected to each other. The semiconductor package 1000 may further include a substrate on which the semiconductor chip 100 is mounted, an encapsulant for sealing the semiconductor chip 100, and the like, which will be described later with reference to FIGS. 6 to 9.

The semiconductor chip 100 may include a semiconductor substrate 110, a circuit layer 120, a protective layer 130, the through-electrode 140, and the shared electrode 150.

The semiconductor substrate 110 may be a semiconductor wafer having opposite front surfaces FS1 and FS2 and back surfaces BS1 and BS2, in which an integrated circuit is formed on the front surfaces FS1 and FS2. The semiconductor substrate 110 may include a semiconductor element such as silicon and germanium, or a compound semiconductor such as silicon carbide (SiC), gallium arsenide (GaAs), indium arsenide (InAs), and indium phosphide (InP). A conductive region doped with impurities and a device isolation region such as shallow trench isolation (STI) may be formed on the front surfaces FS1 and FS2 of the semiconductor substrate 110.

The circuit layer 120 may be disposed on the front surfaces FS1 and FS2 of the semiconductor substrate 110. An integrated circuit (IC) may be formed in the circuit layer 120. The integrated circuit (IC) may include logic circuits such as, for example, a central processor (CPU), a graphics processor (GPU), a field programmable gate array (FPGA), an application processor (AP), a digital signal processor, a cryptographic processor, a microprocessor, a microcontroller, an analog-to-digital converter, an application-specific IC (ASIC) or the like, a volatile memory such as a dynamic random access memory (DRAM), a static RAM (SRAM), or the like, and a memory circuit such as a phase change RAM (PRAM), a magnetic RAM (MRAM), a resistive RAM (RRAM), a flash memory, or the like.

The protective layer 130 may be disposed on the back surfaces BS1 and BS2 of the semiconductor substrate 110, The protective layer 130 may be an insulating layer including, for example, silicon oxide, silicon nitride, a polymer, or combinations thereof. The protective layer 130 may electrically insulate the through-electrode 140 and the shared electrode 150 from the semiconductor substrate 110 and may protect the same from physical and chemical impact. According to an example embodiment of the present inventive concept, the protective layer 130 may further include a rear wiring structure for rewiring or electrically connecting the through-electrode 140 and the shared electrode 150 to each other.

The through-electrode 140 may penetrate through the semiconductor substrate 110 to form a vertical connection path inside the semiconductor chip 100. The through-electrode 140 may be electrically connected to the circuit layer 120 to provide a transmission path for signals transmitted from the integrated circuit (IC) and signals received from the integrated circuit (IC). The through-electrode 140 may be connected to a power circuit or a ground circuit of the integrated circuit (IC). The through-electrode 140 may be electrically connected to a paired shared electrode 150 through the connection line CL. In this case, the connection wiring CL may be a wiring structure ('125' in FIG. 2A) formed in the circuit layer 120 or/and a rear wiring structure formed in the protective layer 130. The through-electrode 140 may be provided as a plurality of through-electrodes 140 arranged in one direction. For example, the semiconductor chip 100 may include a plurality of through-electrodes 140 arranged in a first direction (e.g., a Y-direction) parallel to the front surfaces FS1 and FS2 or the back surfaces BS1 and BS2 of the semiconductor substrate 110. In this case, the plurality of through-electrodes 140 may be electrically connected to a plurality of paired shared electrodes 150.

The shared electrode 150 may penetrate through the semiconductor substrate 110 and may be electrically connected to the through-electrode 140 to form a vertical connection path inside the semiconductor chip 100. The shared electrode 150 may provide a transmission path for a signal transmitted from the integrated circuit IC and a signal received from the integrated circuit IC together with the through-electrode 140. The shared electrode 150 may be electrically connected to a paired through-electrode 140 through the connection line CL In this case, the connection wiring CL may be a wiring structure ('125' in FIG. 2) that is formed in the circuit layer 120 or/and a rear wiring structure that is formed in the protective layer 130. The shared electrode 150 may be provided as a plurality of shared electrodes 150 spaced apart from the through-electrode 140 by a predetermined distance and arranged in one direction. For example, the semiconductor chip 100 may include a plurality of shared electrodes 150 arranged in a first direction (e.g., the Y-direction) and spaced apart from the plurality of through-electrodes 140 in a second direction (e.g., an X-direction) intersecting the first direction (e.g., the Y-direction). In this case, the plurality of shared electrodes 150 may be electrically connected to a plurality of paired through-electrodes 140.

The through-electrode 140 and the shared electrode 150, according to an example embodiment of the present inventive concept, may be disposed symmetrically with respect to a point P at which a first axis X1 passing between the through-electrode 140 and the shared electrode 150 and a second axis X2 passing through a center CP of the semiconductor chip 100 intersect. For example, the through-electrode 140 and the shared electrode 150, which are electrically connected to each other through the connection line CL, may be symmetrically arranged with respect to the point P at which the first axis X1 and the second axis X2 intersect.

According to an example embodiment of the present inventive concept, a plurality of semiconductor chips 100 having the same arrangement (arrangement of the plurality of through-electrodes 140 and the plurality of shared electrodes 150) may be stacked in various forms, and interconnection paths may be formed between the plurality of semiconductor chips 100, by disposing the paired through-electrode 140 and shared electrode 150 in a specific shape.

Figure 3:
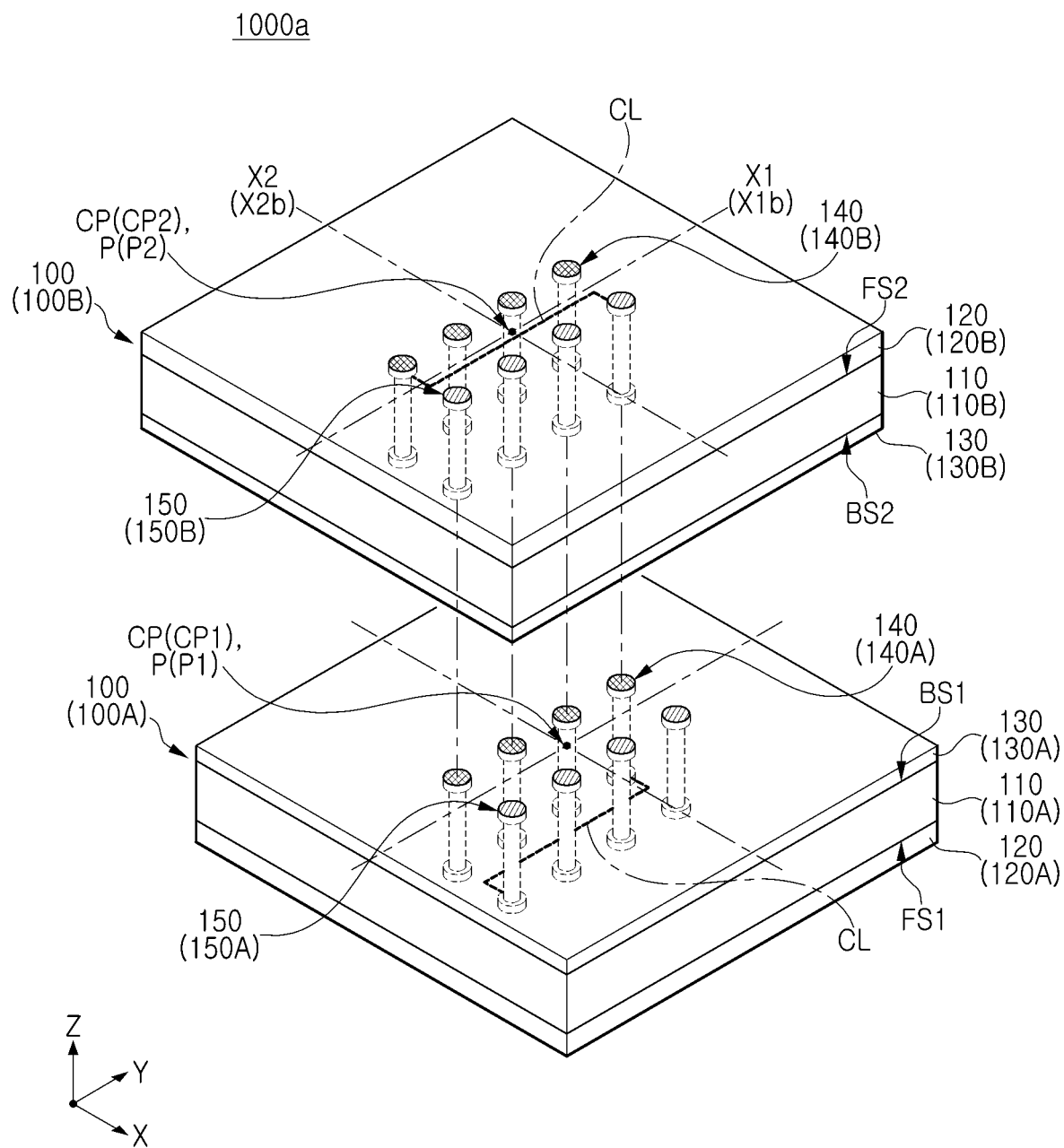
FIG. 3 is an exploded perspective view illustrating a semiconductor package according to an example embodiment of the present inventive concept.
Figure 4:
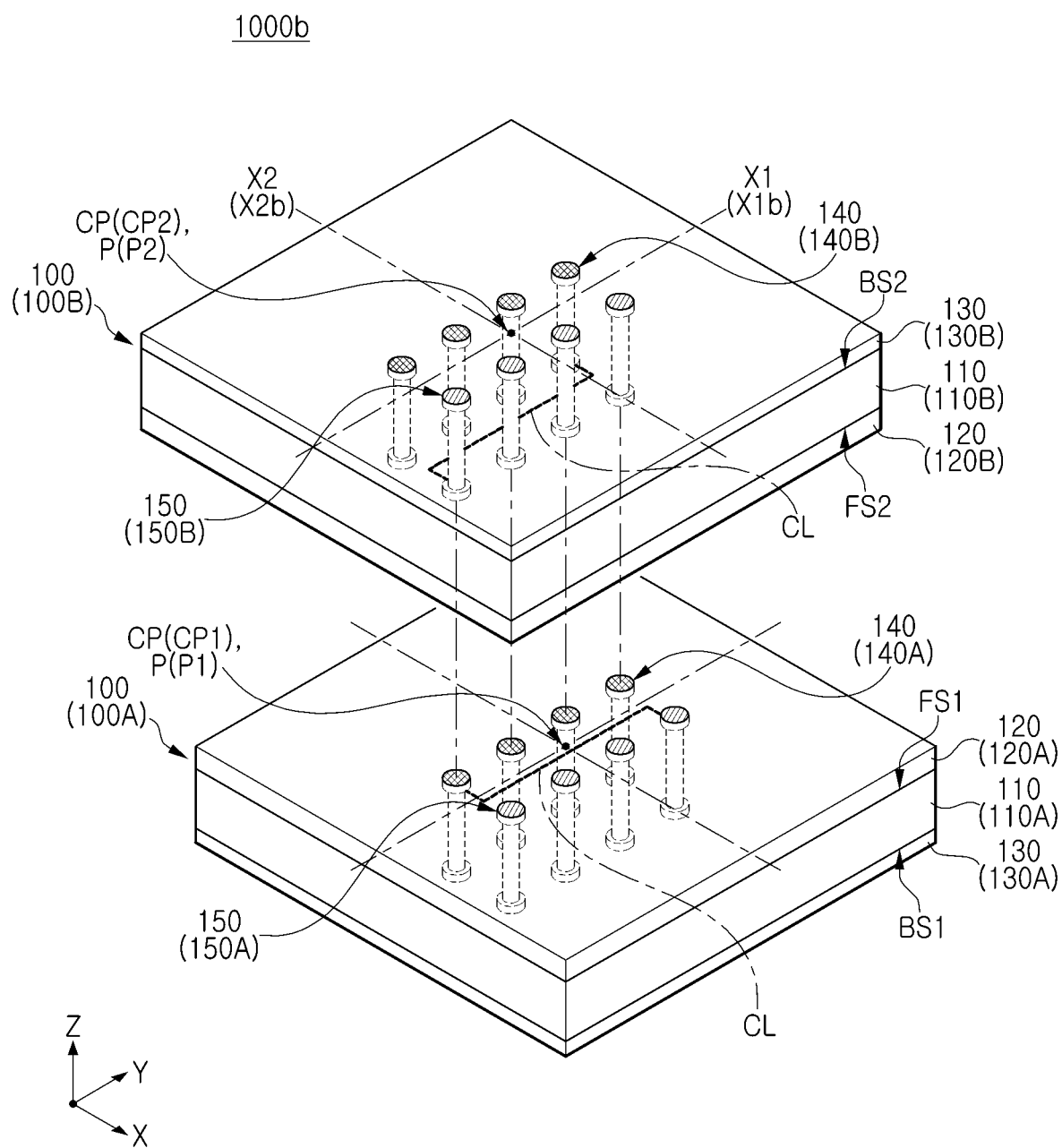
FIG. 4 is an exploded perspective view illustrating a semiconductor package according to an example embodiment of the present inventive concept.

For example, portions of the plurality of semiconductor chips 100 may be stacked such that an active surface and an inactive surface face each other (in the example embodiment of FIG. 1A), and some of the others may be stacked such that the inactive surface and the inactive surface face each other (the example embodiment of FIG. 3) or the active surface and the active surface face each other (the example embodiment of FIG. 4). In this case, the "active surface" indicates one surface of the semiconductor chip 100 corresponding to the first surfaces FS1 and FS2 of the semiconductor substrate 110 on which the circuit layer 120 is formed, and the "inactive surface" indicates the other surface of the semiconductor chip 100 corresponding to the second surfaces BS1 and BS2 of the semiconductor substrate 110.

In addition, at least one of the paired through-electrode 140 and shared electrode 150 may overlap with at least one of the through-electrode 140 and the shared electrode 150 adjacent thereto in the vertical direction (e.g., a Z-direction). For example, a first through-electrode 140A and a first shared electrode 150A, which are electrically connected to each other, may be connected to at least one of a second through-electrode 140B and a second shared electrode 150B, which are electrically connected to each other.

The plurality of semiconductor chips 100 stacked in the vertical direction the Z-direction) may respectively include the semiconductor substrate 110, the circuit layer 120, the protective layer 130, the plurality of through-electrodes 140, and the plurality of shared electrodes 150 described above.

For example, the semiconductor package 1000 may include a first semiconductor chip 100A and a second semiconductor chip 100B disposed on the first semiconductor chip 100A.

The first semiconductor chip 100A may include a first semiconductor substrate 110A, a plurality of first through electrodes 140A, a first circuit layer 120A, and a plurality of first shared electrodes 150A. The first semiconductor substrate 110A may have a first front surface FS1 and a first back surface BS1. The plurality of first through-electrodes 140A may be arranged in a first direction (e.g., the Y-direction). The first circuit layer 120A may be disposed on the first front surface FS1 and may include a first integrated circuit that is electrically connected to the plurality of first through-electrodes 140A. The plurality of first shared electrodes 150A may be spaced apart from the plurality of first through-electrodes 140A in the second direction (e.g., the X-direction) and may be electrically connected to the plurality of first through-electrodes 140A, respectively. For example, the plurality of first through-electrodes 140A and the plurality of first shared electrodes 150A may be arranged in one column along the first axis X1. The first through-electrode 140A may share a signal transmitted from the first integrated circuit, with the first shared electrode 150A electrically connected thereto.

The second semiconductor chip 100B may include a second semiconductor substrate 110B, a plurality of second through-electrodes 140B, a second circuit layer 120B, and a plurality of second shared electrodes 150B. The second semiconductor substrate 110B may have a second front surface FS2 and a second back surface BS2. The plurality of second through-electrodes 140B may be arranged in a first direction (e.g., the Y-direction). The second circuit layer 120B may be disposed on the second front surface FS2 and may include a second integrated circuit electrically connected to the plurality of second through-electrodes 14B. The plurality of second shared electrodes 150B may be spaced apart from the plurality of second through-electrodes 140B in the second direction (e.g., the X-direction) and may be electrically connected to the plurality of second through-electrodes 140B, respectively. For example, the plurality of second through-electrodes 140B and the plurality of second shared electrodes 150B may be arranged in one column along a third axis X1$b$. The second through-electrode 140B may share a signal transmitted from the second integrated circuit, with the second shared electrode 150B electrically connected thereto.

On a plane, at least one pair of through-electrodes 140 and shared electrode 150 electrically connected to each other among the plurality of through-electrodes 140 and the plurality of shared electrodes 150 may be symmetrically arranged with respect to a point P at which a first axis X1 extending in the first direction (e.g., the Y-direction) and a second axis X2 extending in the second direction (e.g., the X-direction) and passing through the center CP of the semiconductor chip 100 intersect, between the plurality of through-electrodes 140 and the plurality of shared electrodes 150.

For example, as illustrated in FIG. 1A, the first through-electrode 140A and the first shared electrode 150A, which are electrically connected to each other, among the plurality of first through-electrodes 140A and the plurality of first shared electrodes 150A may be symmetrically arranged with respect to a first point P1 at which the first axis X1 extending in the first direction (e.g., the Y-direction) and the second axis X2 extending in the second direction (e.g., the X-direction) by penetrating through a first center CP1 of the first semiconductor chip 100A intersect each other.

Among the plurality of second through-electrodes 140B and the plurality of second shared electrodes 150B, a second through-electrode 140B and a second shared electrode 150B, which are electrically connected to each other, may be symmetrically arranged with respect to a second point P2 at which a third axis X1$b$ extending in the first direction (e.g., the Y-direction) and a fourth axis X2$b$ extending in the second direction (e.g., the X-direction) by penetrating through a second center CP2 of the second semiconductor chip 100B intersect each other.

For example, as illustrated in FIG. 1B, a through-electrode 140_1 and a shared electrode 150_1, which form a first electrode pair, may be spaced apart from each other at substantially the same distance with respect to one point P at which the first axis X1 and the second axis X2 intersect each other, and the one point P may be located on a first straight line SL1 that connects the through-electrode 140_1 and the shared electrode 150_1 to each other, constituting the first electrode pair.

A through-electrode 140_2 and a shared electrode 150_2 constituting a second electrode pair are spaced apart from each other at a substantially equal distance from a point P at which the first axis X1 and the second axis X2 intersect each other, and the one point P may be positioned on a second straight line SL2 that connects the through-electrode 140_2 and the shared electrode 150_2 to each other, constituting the second electrode pair.

A through-electrode 140_3 and a shared electrode 150_3 constituting a third electrode pair are spaced apart from each other at a substantially equal distance from a point P at which the first axis X1 and the second axis X2 intersect each other, and the one point (P) may be positioned on a third straight line SL3 that connects the through-electrode 140_3 and the shared electrode 150_3 to each other, forming the third electrode pair.

A through-electrode 140_4 and a shared electrode 150_4 constituting a fourth electrode pair are spaced apart from each other at a substantially equal distance from a point P at which the first axis X1 and the second axis X2 intersect each other, and the one point (P) may be positioned on a fourth straight line SL4 connecting the through-electrode 140_4 and the shared electrode 150_4 to each other, forming the fourth electrode pair.

As in the present embodiment, when the semiconductor chips 100 adjacent to each other among the plurality of semiconductor chips 100 are stacked such that the front surface FS1 or FS2 and the back surface BS1 or BS2 face each other, the semiconductor chips 100 adjacent to each other may be stacked such that the respective centers CP overlap in a vertical direction (e.g., the Z-direction). In addition, the through-electrode 140 may overlap the adjacent through-electrode 140 in the vertical direction (e.g., the Z-direction), and the shared electrode 150 may overlap the adjacent shared electrode 150 in the vertical direction (e.g., the Z-direction).

For example, when the first semiconductor chip 100A and the second semiconductor chip 100B are stacked such that the first back surface BS1 and the second front surface FS2 face each other, the first through-electrode 140A may be connected to the second through-electrode 140B, which overlaps with the first through-electrode 140A, and the first shared electrode 150A may be connected to the second shared electrode 150B, which overlaps with the first shared electrode 150A.

Hereinafter, the structures of the through-electrode 140 and the shared electrode 150 will be described with reference to FIGS. 2A to 2C.

Figure 2A:
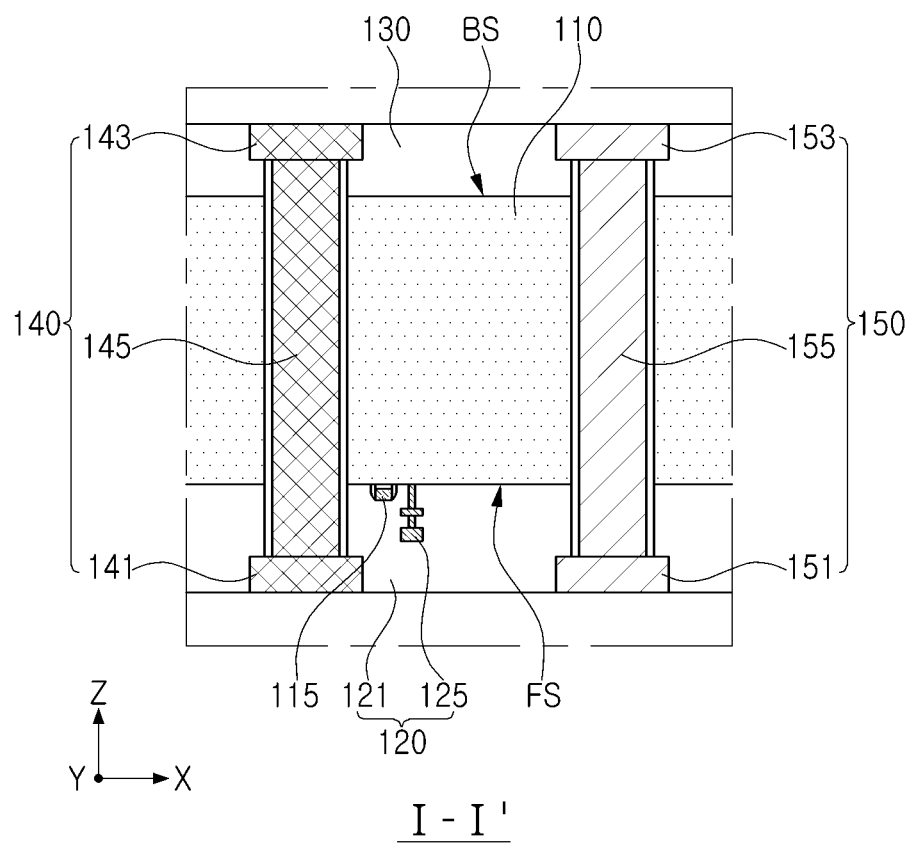
FIG. 2A is a cross-sectional view illustrating a cross-section taken along line I-I' of FIG. 1B, and FIGS. 2B and 2C are cross-sectional views illustrating a through-electrode and a shared electrode according to an example embodiment of the present inventive concept, respectively.
Figure 2B:
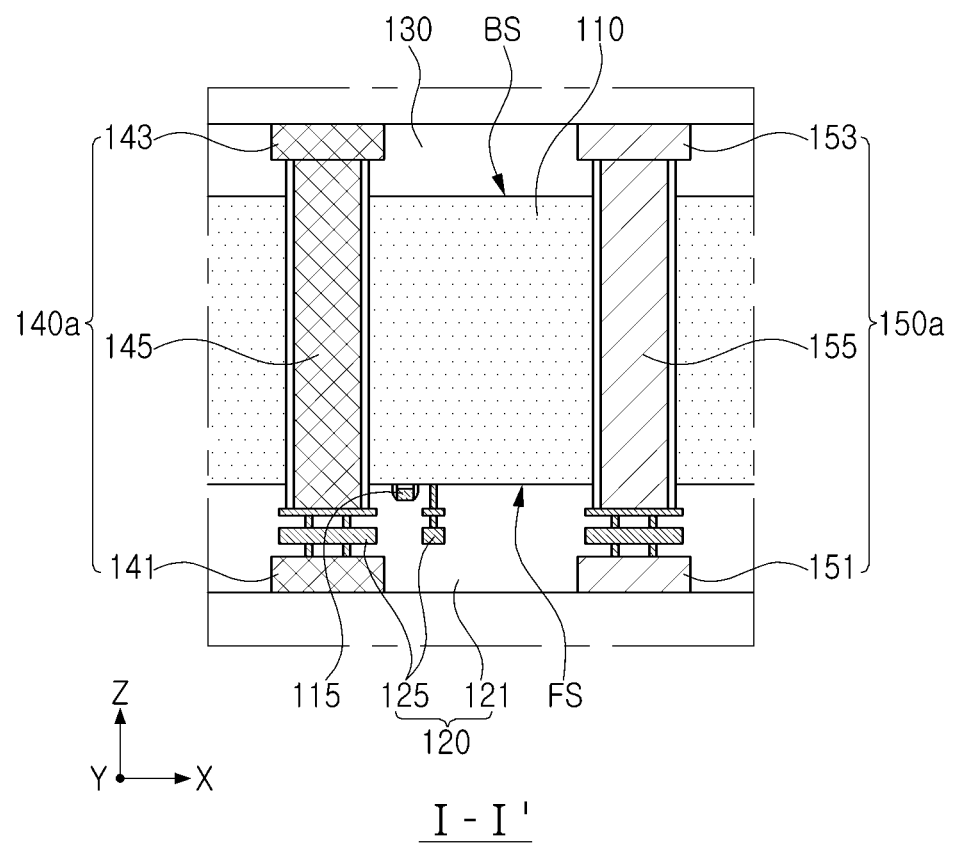
Figure 2C:
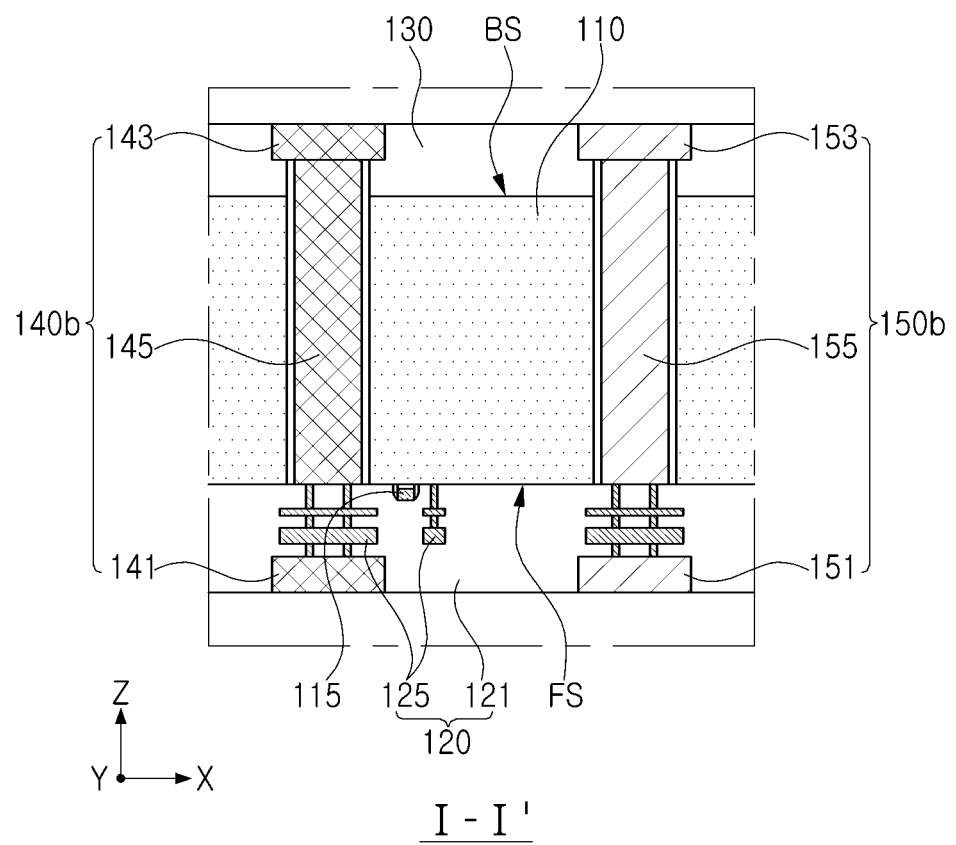

FIG. 2A is a cross-sectional view illustrating a cross-section taken along in FIG. 1B, and FIGS. 2B and 2C are cross-sectional views illustrating through-electrodes 140*a* and 140*b* and shared electrodes 150*a* and 150*b* according to an example embodiment of the present inventive concept, respectively.

First, referring to FIG. 2A, the through-electrode 140 (or the plurality of through-electrodes) may include a front pad 141, a back pad 143, and a through via 145. The front pad 141 may be disposed on the front surface FS and the circuit layer 120. The back pad 143 may be disposed on the back side BS, and the through via 145 may pass through the semiconductor substrate 110 and may electrically connect the front pad 141 and the back pad 143 to each other. In addition, the shared electrode 150 (or a plurality of shared electrodes) may include a front shared pad 151, a rear shared pad 153, and a shared via 155. The front shared pad 151 may be disposed on the front surface FS and the circuit layer 120. The back shared pad 153 may be disposed on the back surface BS, and the shared via 155 may pass through the semiconductor substrate 100 and may electrically connect the front shared pad 151 and the back shared pad 153 to each other. As illustrated in the drawings, as an example, the through via 145 is in direct contact with the front pad 141 and the back pad 143, and the shared via 155 is in direct contact with the front shared pad 151 and the back shared pad 153, but the shape of the through via 145 and the shared via 155 applicable to example embodiments of the present inventive concept is not limited thereto. In addition, the through via 145 and the shared via 155 may be connected to the wiring structure 125 in an area not shown in the drawings.

The front pad 141, the back pad 143, the front shared pad 151, and the back shared pad 153 may include a metal material that includes, for example, copper (Cu), aluminum, (Al), silver (Ag), tin (Sn), gold (Au), nickel (Ni), lead (Pb), titanium (Ti), or alloys thereof.

The through via 145 and the shared via 155 may include a via plug including, for example, tungsten (W), titanium (Ti), aluminum (Al) or copper (Cu) and a side barrier layer surrounding the via plug. The side barrier layer may include, for example, titanium (Ti), titanium nitride (TiN), tantalum (Ta), or tantalum nitride (TaN). A side insulating layer including an insulating material (e.g., High Aspect Ratio Process (HARP) oxide) such as silicon oxide, silicon nitride, or silicon oxynitride may be formed between the through via 145 and the shared via 155 and the semiconductor substrate 110.

The circuit layer 120 may include an interlayer insulating layer 121 and a wiring structure 125. The interlayer insulating layer 121 may include, for example, Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or combinations thereof. At least a portion of the interlayer insulating layer 121 surrounding the wiring structure 125 may be configured as a low-k layer. The interlayer insulating layer 121 may be formed using, for example, a chemical vapor deposition (CVD) process, a flowable-CVD process, or a spin coating process.

The wiring structure 125 may be formed in a multi-layer structure including vias and wiring patterns formed of, for example, aluminum (Al), gold (Au), cobalt (Co), copper (Cu), nickel (Ni), lead (Pb), tantalum (Ta), tellurium (Te), titanium (Ti), tungsten (W), or combinations thereof. A barrier layer including titanium (Ti), titanium nitride (TiN), tantalum (Ta), or tantalum nitride (TaN) may be disposed between the wiring pattern or/and the via and the interlayer insulating layer 121. The wiring structure 125 may be electrically connected to the individual devices 115 formed on the front surface FS of the semiconductor substrate 110. The individual devices 115 may include FETs such as planar FETs and FinFETs, memory devices such as flash memory, DRAM, SRAM, EEPROM, PRAM, MRAM, FeRAM, RRAM, and the like, logic devices such as AND, OR, NOT and the like, various active and/or passive components such as system LSI, CIS, and MEMS.

Referring to FIGS. 2B and 2C, in the through-electrodes 140*a* and 140*b* and the shared electrodes 150*a* and 150*b* according to an example embodiment of the present inventive concept, a through via 145 and a front pad 141 and a shared via 155 and a front shared pad 151 may be connected to each other through the wiring structure 125 of the circuit layer 120.

As illustrated in FIG. 2B, the through-electrode 140*a*, according to an example embodiment of the present inventive concept, may include a front pad 141, a back pad 143, and a through-via 145. The front pad 141 may be disposed on the front surface FS and the circuit layer 120. The back pad 143 may be disposed on the back surface BS. The through-via 145 passes through the semiconductor substrate 110, at least partially extends into the circuit layer 120, and is electrically connected to the front pad 141 through the wiring structure 125.

The shared electrode 150*a* according to an example embodiment of the present inventive concept may include a front shared pad 151, a back shared pad 153, and a shared via 155. The front shared pad 151 may be disposed on the front surface FS and the circuit layer 120. The back shared pad 153 may be disposed on the back surface BS. The shared via 155 may penetrate through the semiconductor substrate 110 to at least partially extend into the circuit layer 120 and may be electrically connected to the front shared pad 151 through the wiring structure 125.

As illustrated in FIG. 2C, the through-electrode 140*b* according to an example embodiment of the present inventive concept may include a front pad 141, a back pad 143, and a through via 145. The front pad 141 may be disposed on the front surface FS and the circuit layer 120. The back pad 143 may be disposed on the back surface BS. The through via 145 may have one surface coplanar with the front surface FS of the semiconductor substrate 110 and may be electrically connected to the front pad 141 through the wiring structure 125.

The shared electrode 150*b* according to an example embodiment of the present inventive concept may include a front shared pad 151, a back shared pad 153, and a shared via 155. The front shared pad 151 may be disposed on the front surface FS and the circuit layer 120. The back shared pad 153 may be disposed on the back surface BS. The shared via 155 may have one surface substantially coplanar with the front surface FS of the semiconductor substrate 110 and may be electrically connected to the front shared pad 151 through the wiring structure 125.

FIG. 3 is an exploded perspective view illustrating a semiconductor package 1000*a* according to an example embodiment of the present inventive concept. FIG. 3 illustrates a state in which the second semiconductor chip 100B of FIG. 1A is rotated by 180 degrees about the fourth axis X2*b*.

Referring to FIG. 3, the semiconductor package 1000*a* according to an example embodiment of the present inventive concept may have the same or similar characteristics as described with reference to FIGS. 1A to 2C, except that adjacent semiconductor chips 100 are stacked such that the back surfaces BS1 and BS2 face each other.

In the present embodiment, semiconductor chips 100 adjacent to each other among the plurality of semiconductor chips 100 may be stacked such that respective back surfaces thereof face each other. In this case, the semiconductor chips 100 adjacent to each other may be disposed such that the respective centers CP are shifted from each other in, for example, the vertical direction (e.g., the Z direction), and at least some of the plurality of through electrodes 140 and the plurality of shared electrodes 150 are alternately connected. For example, the centers CP may be shifted in a horizontal direction (e.g., the X-direction and/or the Y-direction). For example, at least one semiconductor chip 100 among the semiconductor chips 100 adjacent to each other may move in a horizontal direction (e.g., the X-direction), such that any one of the through-electrodes 140 overlaps the adjacent shared electrode 150 in the vertical direction (e.g., the Z-direction), or any one of the shared electrodes 150 overlaps the adjacent through-electrode 140 in the vertical direction (e.g., the Z-direction). For example, when the first semiconductor chip 100A and the second semiconductor chip 100B are stacked such that the first back surface BS1 and the second back surface BS2 face each other, the first through-electrode 140A overlaps the second shared electrode 150B, and the first shared electrode 150A and the second through-electrode 140B might not overlap each other.

FIG. 4 is an exploded perspective view illustrating a semiconductor package 1000*b* according to an example embodiment of the present inventive concept. FIG. 4 illustrates a state in which the first semiconductor chip 100A of FIG. 1A is rotated by 180 degrees about the second axis X2.

Referring to FIG. 4, the semiconductor package 1000*b* according to an example embodiment of the present inventive concept may have the same or similar characteristics as described with reference to FIGS. 1A to 2C, except that the adjacent semiconductor chips 100 are stacked such that the front surfaces FS1 and FS2 face each other.

In the present example embodiment, the semiconductor chips 100 adjacent to each other among the plurality of semiconductor chips 100 may be stacked such that respective front surfaces thereof face each other. In this case, similar to the example embodiment of FIG. 3, the semiconductor chips 100 adjacent to each other may be disposed such that respective centers CP are shifted from each other in, for example, the vertical direction (Z-direction) and at least some of the plurality of through-electrodes 140 and the plurality of the shared electrodes 150 may be alternately connected. For example, the centers CP may be shifted in a horizontal direction (e.g., the X-direction and/or the Y-direction). For example, when the first semiconductor chip 100A and the second semiconductor chip 100B are stacked such that the first front surface FS1 and the second front surface FS2 face each other, the first through-electrode 140A may overlap the second shared electrode 150B, and the first shared electrode 150A and the second through-electrode 140B might not overlap each other.

As described with reference to FIGS. 3 and 4, even when the plurality of semiconductor chips 100 are stacked such that the inactive surface and the inactive surface face each other (the embodiment of FIG. 3) or the active surface and the active surface face each other (the embodiment of FIG. 4), in the semiconductor package according to an example embodiment of the present inventive concept, an interconnection path between the plurality of semiconductor chips 100 may be formed by using the paired through electrode 140 and shared electrode 150.

Figure 5:
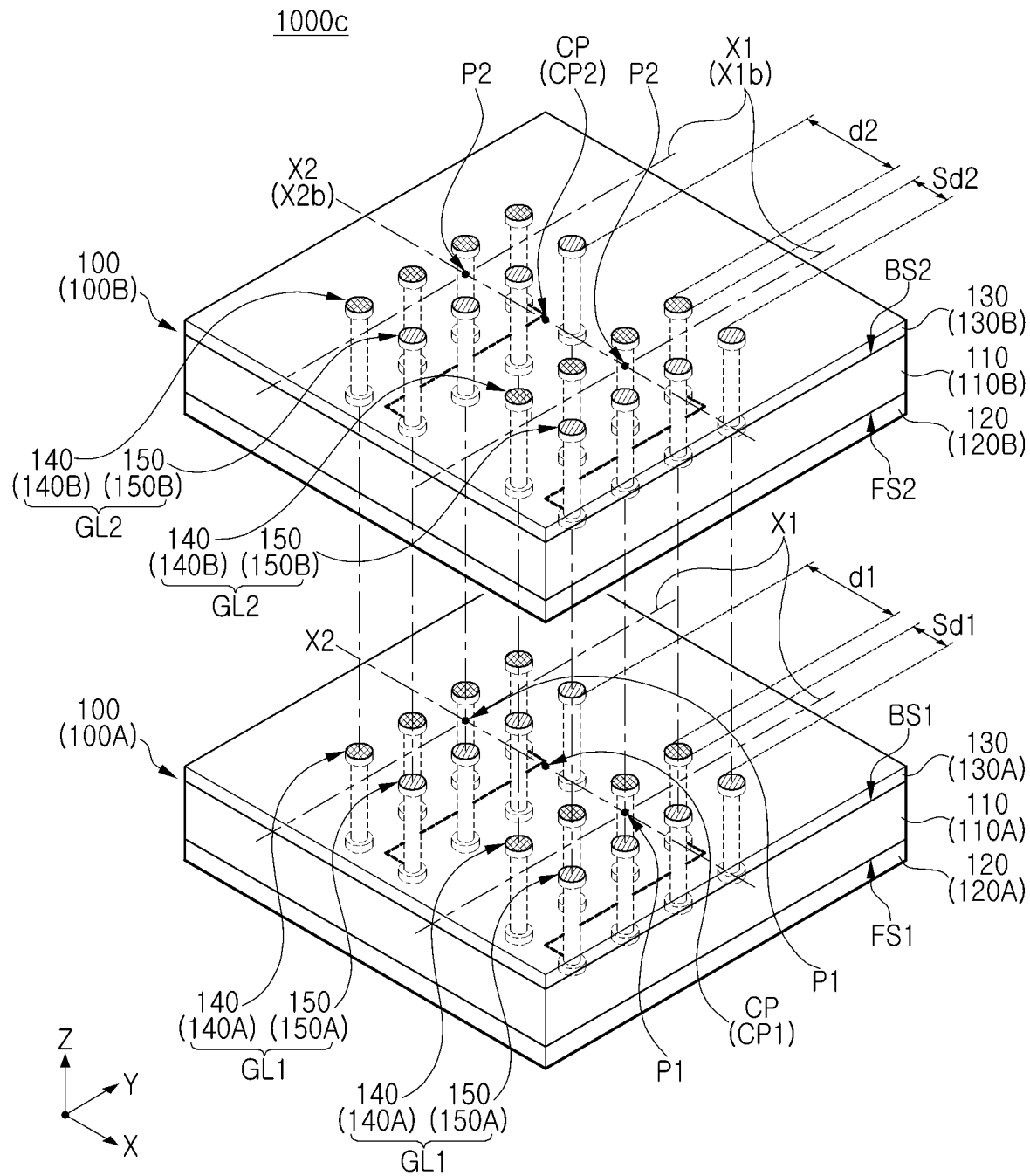
FIG. 5 is an exploded perspective view illustrating a semiconductor package according to an example embodiment of the present inventive concept.

FIG. 5 is an exploded perspective view illustrating a semiconductor package 1000*c* according to an example embodiment of the present inventive concept.

Referring to FIG. 5, the semiconductor package 1000*c* according to an example embodiment of the present inventive concept may have the same or similar characteristics as those described with reference to FIGS. 1A to 4, except that it includes electrode groups GL1 and GL2 arranged along the plurality of first axes X1.

For example, the first semiconductor chip 100A may include a plurality of first electrode groups GL1 respectively corresponding to a plurality of first points P1 at which the plurality of first axes X1 and a second axis X2 intersect each other. Each of the plurality of first electrode groups GL1 may include a plurality of first through electrodes 140A and a plurality of first shared electrodes 150A symmetrically arranged with respect to one corresponding point P1 among the plurality of first points P1.

The second semiconductor chip 100B may include a plurality of second electrode groups GL2 respectively corresponding to a plurality of second points P2 at which the plurality of third axes X1b and the fourth axis X2b intersect each other. Each of the plurality of second electrode groups GL2 may include a plurality of second through-electrodes 140B and a plurality of second shared electrodes 150B symmetrically arranged with respect to one corresponding point P2 among the plurality of second points P2.

The first semiconductor chip 100A and the second semiconductor chip 100B may have the same electrode arrangement (the arrangement of the through-electrodes 140 and the shared electrodes 150). Accordingly, a first separation distance sd1 between the plurality of first through-electrodes 140A and the plurality of first shared electrodes 150A in the second direction (e.g., the X-direction) may be substantially the same as a second separation distance sd2 between the plurality of second through electrodes 140B and the plurality of second shared electrodes 150B in the second direction (e.g., the X-direction). In this case, "substantially the same" may be understood to include differences due to process errors and the like.

A first spacing d1 between the plurality of first electrode groups GL1 may be greater than the first separation distance sd1 in the second direction (e.g., the X-direction) between the plurality of first through electrodes 140A and the plurality of first shared electrodes 150A. A second spacing d2 between the plurality of second electrode groups GL2 may be greater than the second separation distance sd2 in the second direction (e.g., the X-direction) between the plurality of second through electrodes 140B and the plurality of second shared electrodes 150B. Therefore, as in the example embodiment of FIGS. 3 and 4, even when one of the first semiconductor chip 100A and the second semiconductor chip 100B is shifted with respect to the other, the through electrodes 140 and the shared electrodes 150 that do not participate in the interconnection might not overlap each other.

Figure 6:
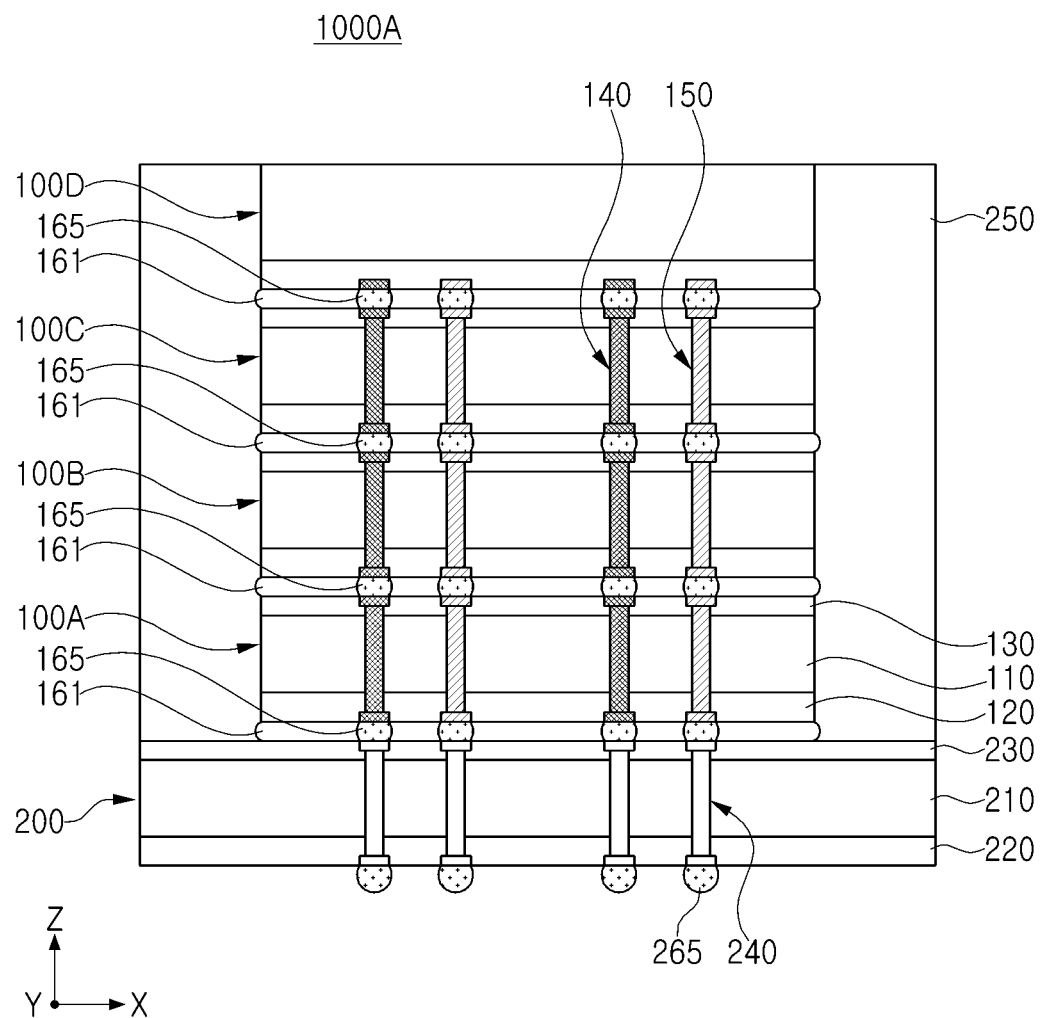
FIG. 6 is a cross-sectional view illustrating a semiconductor package according to an example embodiment of the present inventive concept.

FIG. 6 is a cross-sectional view illustrating a semiconductor package 1000A according to an example embodiment of the present inventive concept.

Referring to FIG. 6, the semiconductor package 1000A according to an example embodiment of the present inventive concept may include a plurality of semiconductor chips 100A, 100B, 100C and 100D and a base chip 200 stacked on each other in a vertical direction (e.g., the Z-axis direction).

The plurality of semiconductor chips 100A, 100B, 100C, and 100D may include the same or similar technical features as those described with reference to FIGS. 1A to 5. For example, the first semiconductor chip 100A, the second semiconductor chip 100B, and the third semiconductor chip 100C may each include a plurality of through-electrodes 140 and a plurality of shared electrodes 150. The plurality of through-electrodes 140 and the plurality of shared electrodes 150 illustrated in the drawings may be electrically connected to the through-electrodes 140 and the shared electrodes 150 located in areas not illustrated in the drawings. The fourth semiconductor chip 100D, which may be at the uppermost position among the semiconductor chips 100A, 100B, 100C and 100D and a base chip 200, might not include the through-electrodes 140 and the shared electrodes 150. The plurality of semiconductor chips 100A, 100B, 100C, and 100D may be electrically connected to each other through interconnection bumps 161. The interconnection bump 161 may be, for example, a conductive bump structure such as a solder ball, a copper (Cu) post or the like. An insulating film 165 surrounding the interconnection bump 161 may be disposed between the plurality of semiconductor chips 100A, 100B, 100C, and 100D. The insulating film 165 may include, for example, a non-conductive film (NCF). According to an example embodiment of the present inventive concept, the plurality of semiconductor chips 100A, 100B, 100C, and 100D may be alternately disposed as in the example embodiments of FIGS. 3 and 4.

The base chip 200 may include a body 210, a front structure 220, a rear structure 230, and a via structure 240. The front structure 220 may be disposed on a lower surface of the body 210. The rear structure 230 may be disposed on the upper surface of the body 210. The base chip 200 may be a dummy chip that does not include individual devices, unlike the plurality of semiconductor chips 100A, 100B, 100C, and 100D, and may be a buffer chip that receives at least one of a control signal, a power signal, and/or a ground signal for operating the plurality of semiconductor chips 100A, 100B, 100C, and 100D from the outside through the via structure 240. The base chip 200 may receive a data signal to be stored in the plurality of semiconductor chips 100A, 100B, 100C, 100D from the outside, or may provide data stored in the plurality of semiconductor chips 100A, 100B, 100C and 100D to the outside (e.g., an external device). In this case, the plurality of semiconductor chips 100A, 100B, 100C, and 100D may be memory chips including volatile memory devices such as DRAM and SRAM or non-volatile memory devices such as PRAM, MRAM, FeRAM, or RRAM.

According to an example embodiment of the present inventive concept, an encapsulant 250 for sealing the plurality of semiconductor chips 100A, 100B, 100C, and 100D may be disposed on the base chip 200, An external connection bump 265 may be disposed below the base chip 200.

The encapsulant 250 may cover respective side surfaces of the plurality of semiconductor chips 100A, 100B, 100C, and 100D such that the plurality of semiconductor chips 100A, 100B, 100C, and 100D are not exposed. The encapsulant 250 may include an insulating resin, for example, Epoxy Molding Compound (EMC).

The external connection bump 265 may have, for example, a land, ball, or pin structure. The external connection bump 265 may include, for example, tin (Sn), indium (In), bismuth (Bi), antimony (Sb), copper (Cu), silver (Ag), zinc (Zn), lead (Pb) and/or alloys thereof (e.g., Sn—Ag—Cu).

Figure 7:
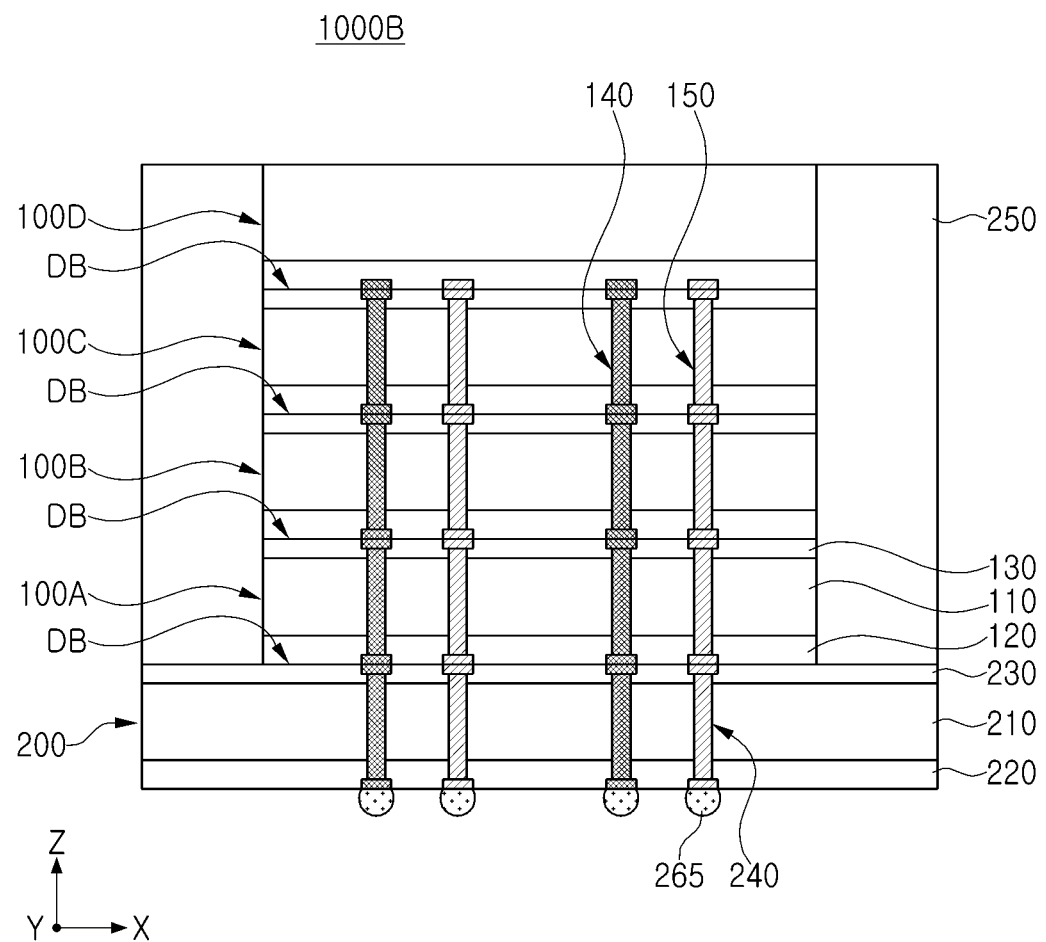
FIG. 7 is a cross-sectional view illustrating a semiconductor package according to an example embodiment of the present inventive concept.

FIG. 7 is a cross-sectional view illustrating a semiconductor package 1000B according to an example embodiment of the present inventive concept.

Referring to FIG. 7, the semiconductor package 1000B may have the same or similar characteristics as those described with reference to FIGS. 1A to 6, except that a plurality of semiconductor chips 100A, 100B, 100C, and 100D are directly bonded and connected (that may be referred to as, for example, hybrid bonding, direct bonding, metal bonding, or the like) to each other without a separate connecting member, for example, the interconnection bump 161 of FIG. 6.

In the present embodiment, on a bonding surface DB, a plurality of through electrodes 140, a plurality of shared electrodes 150, a circuit layer 120, and a protective layer 130 may be vertically stacked, and may be bonded and combined between the plurality of semiconductor chips 100A, 100B, 100C and 100D. The vertically stacked circuit layer 120 and protective layer 130 may include a material capable of bonding and combining the same to each other. For example, the circuit layer 120 and the protective layer 130 may include at least one of, for example, silicon oxide (SiO), silicon nitride (SiN), and silicon carbonitride (SiCN). The bonding surface DB may be formed by being bonded and combined by performing a thermal compression process. For example, the thermal compression process may be performed in a thermal atmosphere of about 300° C., but the present inventive concept is not limited thereto.

Figure 8:
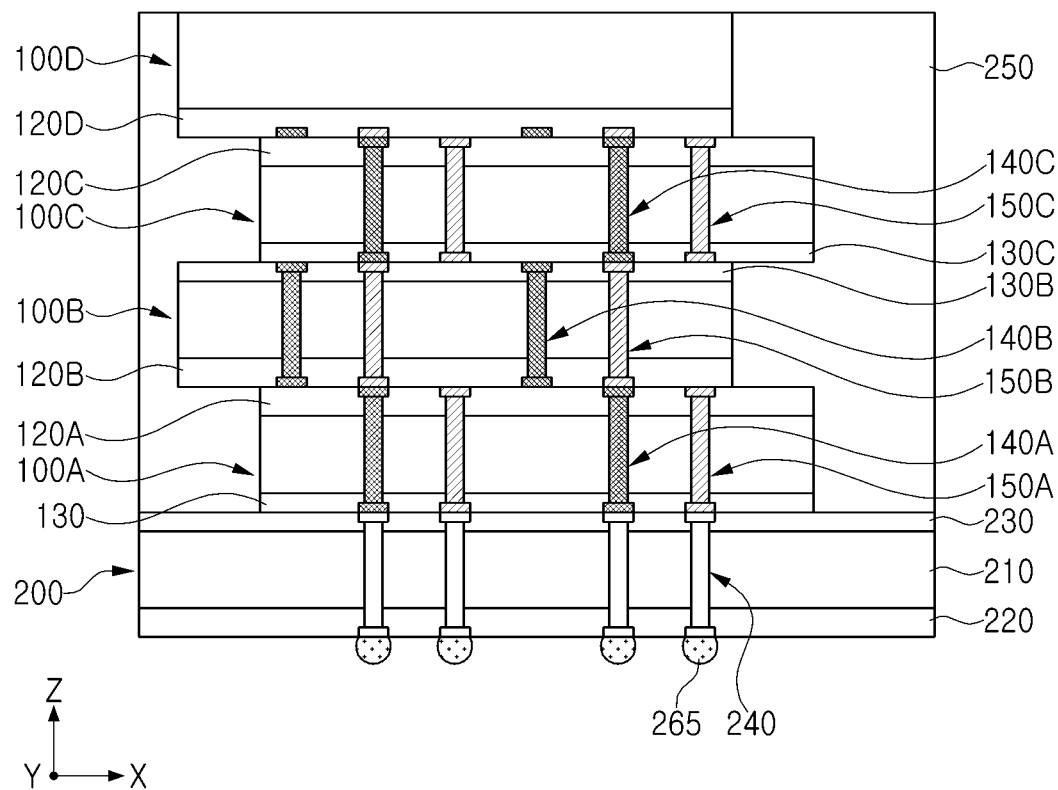
FIG. 8 is a cross-sectional view illustrating a semiconductor package according to an example embodiment of the present inventive concept.

FIG. 8 is a cross-sectional view illustrating a semiconductor package 1000C according to an example embodiment of the present inventive concept.

Referring to FIG. 8, the semiconductor package 1000C according to an example embodiment of the present inventive concept may have the same or similar characteristics as those described with reference to FIGS. 1A to 7, except that it includes a plurality of semiconductor chips 100A, 100B, 100C, and 100D stacked by shifting laterally. For example, the first semiconductor chip 100A and the second semiconductor chip 100B may be stacked such that the first circuit layer 120A and the second circuit layer 120B face each other, and the second semiconductor chip 100B and the third semiconductor chip 100C may be stacked such that the second protective layer 130B and the third protective layer 130C face each other. The first through-electrode 140A may vertically overlap the second shared electrode 150B, and the first shared electrode 150A and the second through-electrode 140B might not overlap each other. In addition, the second shared electrode 150B may vertically overlap the third through-electrode 140C, and the second through-electrode 140B and the third shared electrode 150C might not overlap each other. As described above, according to an example embodiment of the present inventive concept, the plurality of semiconductor chips 100A, 100B, 100C, and 100D may be stacked in various manners and form an interconnection path therebetween by moving some semiconductor chips to one side.

Figure 9:
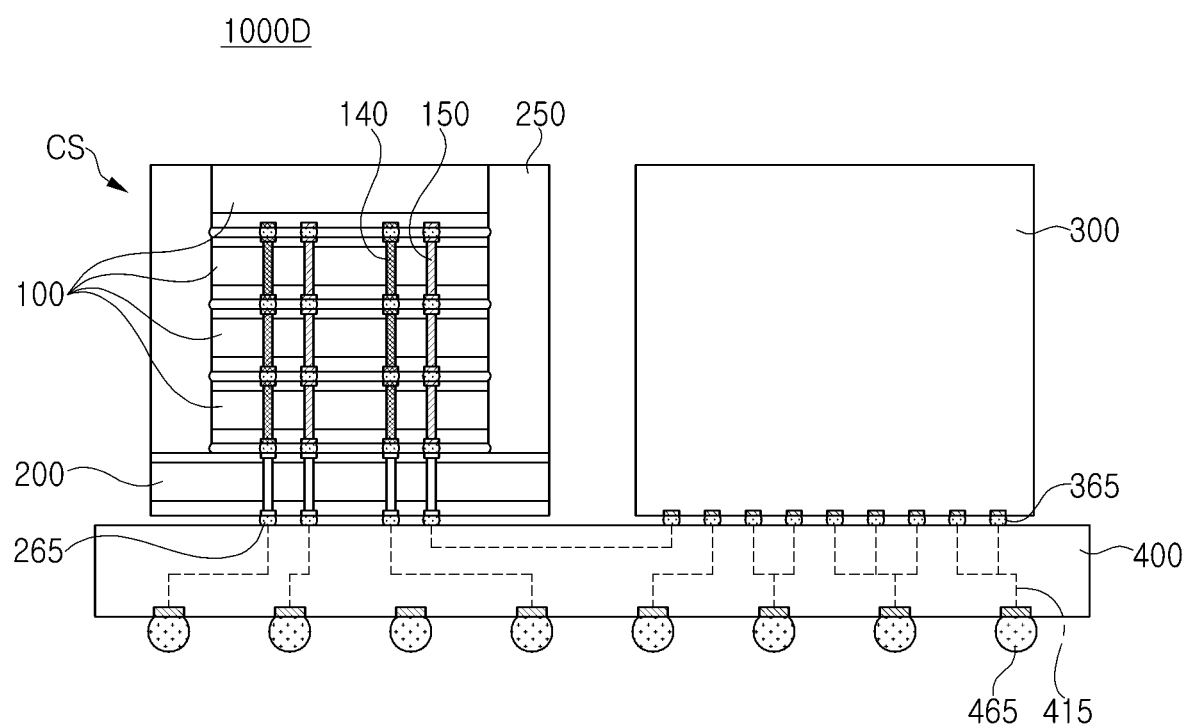
FIG. 9 is a cross-sectional view illustrating a semiconductor package according to an example embodiment of the present inventive concept.

FIG. 9 is a cross-sectional view illustrating a semiconductor package 1000D according to an example embodiment of the present inventive concept.

Referring to FIG. 9, the semiconductor package 1000D according to an example embodiment may include at least one chip structure CS, at least one processor chip 300, and a substrate 400.

The chip structure CS may have the same or similar characteristics to the semiconductor packages 1000, 1000a, 1000b, 1000c, 1000A, 1000B and 1000C described with reference to FIGS. 1A to 8. For example, the chip structure CS may include a plurality of semiconductor chips 100 including a plurality of through-electrodes 140 and a plurality of shared electrodes 150.

The processor chip 300 may include, for example, a CPU, a GPU, an FPGA, a DSP, an ASIC, and the like. According to an example embodiment of the present inventive concept, the processor chip 300 may be attached in a packaged state to the substrate 400, and may be a package of which a normal operation has been verified, a known good package (KGP). The processor chip 300 may be electrically connected to the substrate 400 through the lower connection bump 365. The processor chip 300 may be electrically connected to the chip structure CS through the substrate 400.

The substrate 400 may be a support substrate on which the chip structure CS and the processor chip 300 are mounted, and may be a substrate for a semiconductor package, including, for example, a printed circuit board (PCB), a ceramic substrate, a glass substrate, a tape wiring board, and the like. The substrate 400 may include a redistribution circuit 415 that redistributes the chip structure CS and the processor chip 300 and electrically connects the chip structure CS and the processor chip 300 to a connection terminal 465.

As set forth above, according to an example embodiment of the present inventive concept, a semiconductor package, in which semiconductor chips are easily stacked by introducing a through-electrode and a shared electrode electrically connected to each other, may be provided.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package comprising:
a first semiconductor chip including a plurality of first through-electrodes and a plurality of first shared electrodes, wherein the first through-electrodes are arranged in a first direction, wherein the plurality of first shared electrodes are spaced apart from the plurality of first through-electrodes in a second direction, intersecting the first direction, and are electrically connected to the plurality of first through-electrodes, respectively; and
a second semiconductor chip including a plurality of second through-electrodes and a plurality of second shared electrodes, wherein the plurality of second through-electrodes are disposed on the first semiconductor chip and are arranged in the first direction, wherein the plurality of second shared electrodes are spaced apart from the plurality of second through-electrodes in the second direction and are electrically connected to the plurality of second through-electrodes, respectively,
wherein a first through-electrode and a first shared electrode, which are electrically connected to each other, from among the plurality of first through-electrodes and the plurality of first shared electrodes are symmetrically arranged with respect to a first point at which a first axis, extending in the first direction and passing through a first center of the first semiconductor chip, and a second axis, extending in the second direction and passing through the first center of the first semiconductor chip, intersect,
wherein a second through-electrode and a second shared electrode, which are electrically connected to each other, from among the plurality of second through-electrodes and the plurality of second shared electrodes are symmetrically arranged with respect to a second point at which a third axis, extending in the first direction and passing through a second center of the second semiconductor chip, and a fourth axis, extending in the second direction and passing through the second center of the second semiconductor chip, intersect, and
wherein the first through-electrode and the first shared electrode are connected to at least one of the second through-electrode or the second shared electrode.

2. The semiconductor package of claim 1, wherein the first semiconductor chip further includes a first semiconductor substrate and a first circuit layer, wherein the first semiconductor substrate has a first front surface and a first back surface opposing each other, and the first circuit layer is disposed on the first front surface and includes a first integrated circuit electrically connected to the plurality of first through-electrodes, and wherein the second semiconductor chip further includes a second semiconductor substrate and a second circuit layer, wherein the second semiconductor substrate has a second front surface and a second back surface opposing each other, and the second circuit layer is disposed on the second front surface and includes a second integrated circuit electrically connected to the plurality of second through-electrodes.

3. The semiconductor package of claim 2, wherein when the first semiconductor chip and the second semiconductor chip are stacked such that the first back surface and the second front surface face each other, the first through-electrode is connected to the second through-electrode, and the first shared electrode is connected to the second shared electrode.

4. The semiconductor package of claim 2, wherein when the first semiconductor chip and the second semiconductor chip are stacked such that the first back surface and the second back surface face each other or the first front surface and the second front surface face each other, the first through-electrode is connected to the second shared electrode, or the first shared electrode is connected to the second through-electrode.

5. The semiconductor package of claim 2, wherein the first through-electrode shares a signal transmitted from the first integrated circuit with the first shared electrode electrically connected to the first through-electrode, and wherein the second through-electrode shares a signal transmitted from the second integrated circuit with the second shared electrode electrically connected to the second through-electrode.

6. The semiconductor package of claim 1, wherein the plurality of first through-electrodes and the plurality of first shared electrodes are each arranged in one row along the first axis, and wherein the plurality of second through-electrodes and the plurality of second shared electrodes are each arranged in one row along the third axis.

7. The semiconductor package of claim 1, wherein the first axis is a plurality, wherein the first semiconductor chip includes a plurality of first electrode groups respectively corresponding to a plurality of first points at which the plurality of the first axes and the second axis intersect each other, wherein each of the plurality of first electrode groups includes a plurality of first through-electrodes and the plurality of first shared electrodes that are symmetrically arranged with respect to a corresponding one of the plurality of first points, wherein the third axis is a plurality, wherein the second semiconductor chip includes a plurality of second electrode groups respectively corresponding to a plurality of second points at which the plurality of the third axes and the fourth axis intersect each other, and wherein each of the plurality of second electrode groups includes the plurality of second through-electrodes and the plurality of second shared electrodes that are symmetrically arranged with respect o a corresponding one of the plurality of second points.

8. The semi conductor package of claim 7, wherein a first separation distance between the plurality of first through-electrodes and the plurality of first shared electrodes in the second direction is substantially equal to a second separation distance between the plurality of second through-electrodes and the plurality of second shared electrodes in the second direction.

9. The semiconductor package of claim 7, wherein a first spacing between the plurality of first electrode groups is greater than a first separation distance between the plurality of first through-electrodes and the plurality of first shared electrodes in the second direction, and wherein a second spacing between the plurality of second electrode groups is greater than a second separation distance between the plurality of second through-electrodes and the plurality of second shared electrodes in the second direction.

* * * * *